(12) United States Patent
Yamauchi et al.

(10) Patent No.: US 7,342,422 B2
(45) Date of Patent: Mar. 11, 2008

(54) SEMICONDUCTOR DEVICE HAVING SUPER JUNCTION STRUCTURE AND METHOD FOR MANUFACTURING THE SAME

(75) Inventors: Shoichi Yamauchi, Nagoya (JP); Tomoatsu Makino, Okazaki (JP); Makoto Kuwahara, Nagoya (JP); Yoshiyuki Hattori, Aichi-gun (JP)

(73) Assignee: DENSO CORPORATION, Kariya (JP)

( * ) Notice: Subject to any disclaimer, the term of this patent is extended or adjusted under 35 U.S.C. 154(b) by 68 days.

(21) Appl. No.: 11/472,547

(22) Filed: Jun. 22, 2006

(65) Prior Publication Data

US 2007/0013412 A1 Jan. 18, 2007

(30) Foreign Application Priority Data

Jun. 23, 2005 (JP) ............................. 2005-182905

(51) Int. Cl.
*H01L 25/00* (2006.01)
*H03K 19/00* (2006.01)

(52) U.S. Cl. ...................... 326/101; 326/102; 326/103; 257/328; 257/341

(58) Field of Classification Search ........ 326/101–103; 257/327–328, 330, 341
See application file for complete search history.

(56) References Cited

U.S. PATENT DOCUMENTS

| 6,982,459 | B2 | 1/2003 | Suzuki et al. |
| 6,639,260 | B2 | 10/2003 | Suzuki et al. |
| 6,844,592 | B2 | 1/2005 | Yamaguchi et al. |
| 7,161,209 | B2 * | 1/2007 | Saito et al. .................. 257/341 |
| 2005/0098826 | A1 | 5/2005 | Yamaguchi et al. |

* cited by examiner

*Primary Examiner*—Anh Q. Tran
(74) *Attorney, Agent, or Firm*—Posz Law Group, PLC

(57) ABSTRACT

A semiconductor device includes: a cell region; a terminal region; a lower semiconductor layer; a intermediate semiconductor layer on the lower semiconductor layer including a super junction structure; a terminal upper semiconductor layer on the intermediate semiconductor layer; a terminal contact semiconductor region on a surface portion of the terminal upper semiconductor layer adjacent to the cell region; an insulation layer on the terminal upper semiconductor layer having a first part adjacent to the cell region with a small thickness and a second part adjacent to the first part with a large thickness; and a conductive layer in the cell region and a part of the terminal region, the conductive layer extending from the cell region to the part of the terminal region beyond the first part of the insulation layer.

7 Claims, 7 Drawing Sheets

SEMICONDUCTOR DEVICE HAVING SUPER JUNCTION STRUCTURE AND METHOD FOR MANUFACTURING THE SAME

CROSS REFERENCE TO RELATED APPLICATION

This application is based on Japanese Patent Application No. 2005-182905 filed on Jun. 23, 2005, the disclosure of which is incorporated herein by reference.

FIELD OF THE INVENTION

The present invention relates to a semiconductor device having a super junction structure and a method for manufacturing the same.

BACKGROUND OF THE INVENTION

To respond a requirement of increase in withstanding voltage and decrease in on-resistance (or decrease in on-voltage) of a semiconductor device, a semiconductor device having the SJ structure has been developed, and in particular a semiconductor device having the SJ structure in both of the cell region and the terminal region is actively developed. The SJ structure is provided in not only in the cell region but also in the terminal region, thereby a depleted region (meaning an expansion area of a depletion layer when the semiconductor device is turned off) can be formed in a wide area of the terminal region, and consequently withstanding voltage of both of the cell region and the terminal region can be improved.

This type of semiconductor device is often formed by using a semiconductor stack in which a semiconductor lower-layer and a semiconductor intermediate-layer are stacked. In the semiconductor intermediate-layer, the SJ structure is formed. In many cases, when the semiconductor stack is seen in a plane view, the cell region in which a vertical semiconductor-switching-cell group is built is provided in a central side of the semiconductor stack, and the terminal region is provided around the periphery of the cell region.

A plurality of vertical switching cells is formed in the cell region. For example, in the case that the vertical semiconductor switching cell is MOSFET (Metal Oxide Semiconductor Field Effect Transistor), the semiconductor lower-layer is called a drain layer, and a drain electrode is connected to the drain layer. When the vertical semiconductor switching cell is IGBT (Insulated Gate Bipolar Transistor), a collector layer in an opposite conduction type is provided on a back of the semiconductor lower-layer, and a collector electrode is connected to the collector layer. When a gate structure of the vertical semiconductor switching cell is in a planar type, a body region is formed in an upper region of the SJ structure, and a planar gate electrode is formed opposite to the body region. Alternatively, when the gate structure of the vertical semiconductor switching cell is in a trench type, a semiconductor upper-layer in a conduction type opposite to the semiconductor lower-layer is formed on a surface of the SJ structure, and a trench gate electrode that penetrates the semiconductor upper-layer is formed.

An avalanche resistance check of a semiconductor device is often carried out by an L-load surge resistance test and the like. In the L-load surge resistance test, excessive energy is supplied to the semiconductor device to forcibly induce breakdown. The breakdown is induced in a region of more than critical electric-field strength. Considering an area ratio between the cell region and the terminal region, breakdown is induced in a side of the cell region having a larger area, thereby avalanche energy per unit area can be reduced compared with a case that breakdown is induced in a side of the terminal region having a smaller area. Therefore, if breakdown is induced in the cell region side, local consumption of excessive avalanche energy can be suppressed, consequently occurrence of breakdown of the semiconductor device can be suppressed. To realize the phenomenon, withstanding voltage of the terminal region must be made high compared with standing voltage of the cell region, so that breakdown is induced dominantly in the cell region.

JP-A-2003-273355, which corresponds to US 2005-0098826-A1 and U.S. Pat. No. 6,844,592, proposes a semiconductor device in which an insulating layer and a field plate are provided on a surface of the SJ structure in the terminal region. Furthermore, it proposes a structure in which thickness of the insulating layer is increased stepwise from the side of the cell region to the side of a region opposite to the cell region.

When a combined structure of an insulating layer and a field plate is provided in the terminal region, an electric field in an upper region of the terminal region can be reduced. While the above prior art does not describe the following operation and effects in detail, when an insulating layer whose thickness is increased stepwise is used, an electric field near a boundary between the cell region and the terminal region, in which the electric field tends to be concentrated, can be reduced. It has been found from study of the inventors that an insulating layer which was adjusted to be thin is formed in the cell region side, thereby a significant effect of reducing the electric field near the boundary between the cell region and the terminal region is obtained. Thus, breakdown of the semiconductor device due to local concentration of the electric field can be avoided.

However, as described before, in this type of semiconductor device, it is important that a relationship of "terminal region>cell region" is established between the withstanding voltage of the cell region and the withstanding voltage of the terminal region. The withstanding voltage of the cell region and that of the terminal region are mainly determined by height in a thickness direction of depleted regions formed in respective regions if the breakdown due to the local concentration of the electric field does not occur. In the semiconductor device of the above prior art, the height in the thickness direction of the depleted regions formed in both the cell region and the terminal region corresponds to height in the thickness direction of SJ structures formed in both. The height in the thickness direction of the cell region is equal to that of the terminal region. Therefore, the semiconductor device of the patent literature 1 has a limitation in that the withstanding voltage of the terminal region can be made equal to the withstanding voltage of the cell region at the maximum, or can not be made high compared with the withstanding voltage of the cell region.

SUMMARY OF THE INVENTION

In view of the above-described problem, it is an object of the present disclosure to provide a semiconductor device having a super junction structure. It is another object of the present disclosure to provide a method for manufacturing a semiconductor device having a super junction structure.

According to a first aspect of the present disclosure, a semiconductor device includes: a cell region including a plurality of semiconductor switching cells; a terminal region disposed around the cell region; a lower semiconductor layer having a first conductive type; a intermediate semiconductor layer disposed on the lower semiconductor layer, wherein the intermediate semiconductor layer includes a super junction structure, in which a first region having the first conductive type and a second region having a second conductive type are repeatedly arranged in a horizontal direction perpendicular to a thickness direction of the intermediate semiconductor layer, and wherein the first region extends in the thickness direction of the intermediate semiconductor layer, and the second region extends in the thickness direction of the intermediate semiconductor layer; a terminal upper semiconductor layer disposed on the intermediate semiconductor layer in the terminal region, wherein the terminal upper semiconductor layer has the second conductive type and a low impurity concentration; a terminal contact semiconductor region disposed on a surface portion of the terminal upper semiconductor layer in the terminal region, wherein the terminal contact semiconductor region is disposed adjacent to the cell region, and wherein the terminal contact semiconductor region has the second conductive type and a high impurity concentration; an insulation layer disposed on the terminal upper semiconductor layer in the terminal region, wherein the insulation layer has first and second parts, the first part which is disposed adjacent to the cell region and has a small thickness, and the second part which is disposed adjacent to the first part of the insulation layer and has a large thickness, and wherein the first part of the insulation layer is disposed on the terminal contact semiconductor region and on a part of the terminal upper semiconductor layer; and a conductive layer disposed in the cell region and a part of the terminal region, wherein the conductive layer is disposed on the first part of the insulation layer and on a part of the second part of the insulation layer so that the conductive layer extends from the cell region to the part of the terminal region beyond the first part of the insulation layer.

In the above device, the terminal upper semiconductor layer is disposed on the surface portion of the intermediate semiconductor layer in the terminal region. Since the impurity concentration of the terminal upper semiconductor layer is low, a depletion layer expands in the terminal upper semiconductor layer when the device turns off. Accordingly, a depletion region in the terminal region has a height in the thickness direction of the intermediate semiconductor layer, the height which is larger than that of a depletion region in the cell region. Accordingly, by controlling the thickness of the terminal upper semiconductor layer, the height of the depletion region in the terminal region becomes larger than that of the depletion region in the cell region. Thus, the withstand voltage of the terminal region becomes higher than that of the cell region. Further, the thickness of the first part of the insulation layer on the terminal upper semiconductor layer is thin. Furthermore, the conductive layer is formed on the first part of the insulation layer. Thus, a local electric field concentration near the terminal contact semiconductor region is reduced, so that the withstand voltage of the terminal region becomes higher than that of the cell region.

According to a second aspect of the present disclosure, a semiconductor device includes: a cell region including a plurality of semiconductor switching cells; a terminal region disposed around the cell region; a lower semiconductor layer having a first conductive type; a intermediate semiconductor layer disposed on the lower semiconductor layer, wherein the intermediate semiconductor layer includes a super junction structure, in which a first region having the first conductive type and a second region having a second conductive type are repeatedly arranged in a horizontal direction perpendicular to a thickness direction of the intermediate semiconductor layer, and wherein the first region extends in the thickness direction of the intermediate semiconductor layer, and the second region extends in the thickness direction of the intermediate semiconductor layer; a terminal upper semiconductor layer disposed on the intermediate semiconductor layer in the terminal region, wherein the terminal upper semiconductor layer has the second conductive type and a low impurity concentration; a terminal contact semiconductor region disposed on a surface portion of the terminal upper semiconductor layer in the terminal region, wherein the terminal contact semiconductor region is disposed adjacent to the cell region, and wherein the terminal contact semiconductor region has the second conductive type and a high impurity concentration; a second conductive type semiconductor region adjacent to the terminal contact semiconductor region, wherein the second conductive type semiconductor region is disposed on another surface portion of the terminal upper semiconductor layer in the terminal region, and wherein the second conductive type semiconductor region has the second conductive type and an impurity concentration, which is lower than that of the terminal contact semiconductor region, and higher than that of the terminal upper semiconductor layer; an insulation layer disposed on a part of the terminal contact semiconductor region and on the terminal upper semiconductor layer in the terminal region; and a conductive layer disposed on another part of the terminal contact semiconductor region and on a part of the insulation layer.

In the above device, a local electric field concentration may be easily occurred at a boundary between the cell region and the terminal region. Accordingly, when the second conductive type semiconductor region is disposed near the boundary, the local electric field concentration is much reduced. Since the height of the depletion region in the terminal region is larger than that in the cell region, the withstand voltage in the terminal region is much higher than that in the cell region.

According to a third aspect of the present disclosure, a method for manufacturing a semiconductor device including a cell region and a terminal region disposed around the cell region is provided. The cell region includes a plurality of semiconductor switching cells. The method includes steps of: preparing a lower semiconductor layer having a first conductive type; forming an intermediate semiconductor layer on the lower semiconductor layer, wherein the intermediate semiconductor layer includes a super junction structure, in which a first region having the first conductive type and a second region having a second conductive type are repeatedly arranged in a horizontal direction perpendicular to a thickness direction of the intermediate semiconductor layer, and wherein the first region extends in the thickness direction of the intermediate semiconductor layer, and the second region extends in the thickness direction of the intermediate semiconductor layer; forming a terminal upper semiconductor layer on the intermediate semiconductor layer in the terminal region, wherein the terminal upper semiconductor layer has the second conductive type and a low impurity concentration; forming a terminal contact semiconductor region on a surface portion of the terminal upper semiconductor layer in the terminal region, wherein the terminal contact semiconductor region is disposed adjacent to the cell region, and wherein the terminal contact semiconductor region has the second conductive type and a high impurity concentration; forming an insulation layer on the terminal upper semiconductor layer in the terminal region, wherein the insulation layer has first and second parts, the first part which is disposed adjacent to the cell region and has a small thickness, and the second part which is disposed adjacent to the first part of the insulation layer and has a large thickness, and wherein the first part of the insulation layer is disposed on the terminal contact semiconductor region and on a part of the terminal upper semiconductor layer; and forming a conductive layer in the cell region and a part of the terminal region, wherein the conductive layer is disposed on the first part of the insulation layer and on a part of the second part of the insulation layer so that the conductive layer extends from the cell region to the part of the terminal region beyond the first part of the insulation layer.

The above method provides the device, in which the withstand voltage of the terminal region becomes higher than that of the cell region.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Hereinafter, the embodiment is described in detail with reference to drawings. While an example using a silicon base material as a semiconductor material is shown in a semiconductor device in the following embodiments, the material is not limited to that in the example, and another semiconductor material such as gallium arsenide (GaAs) base material, silicon carbide (SiC) base material, or gallium nitride (GaN) base material, or combination of them may be used.

Figure 1:
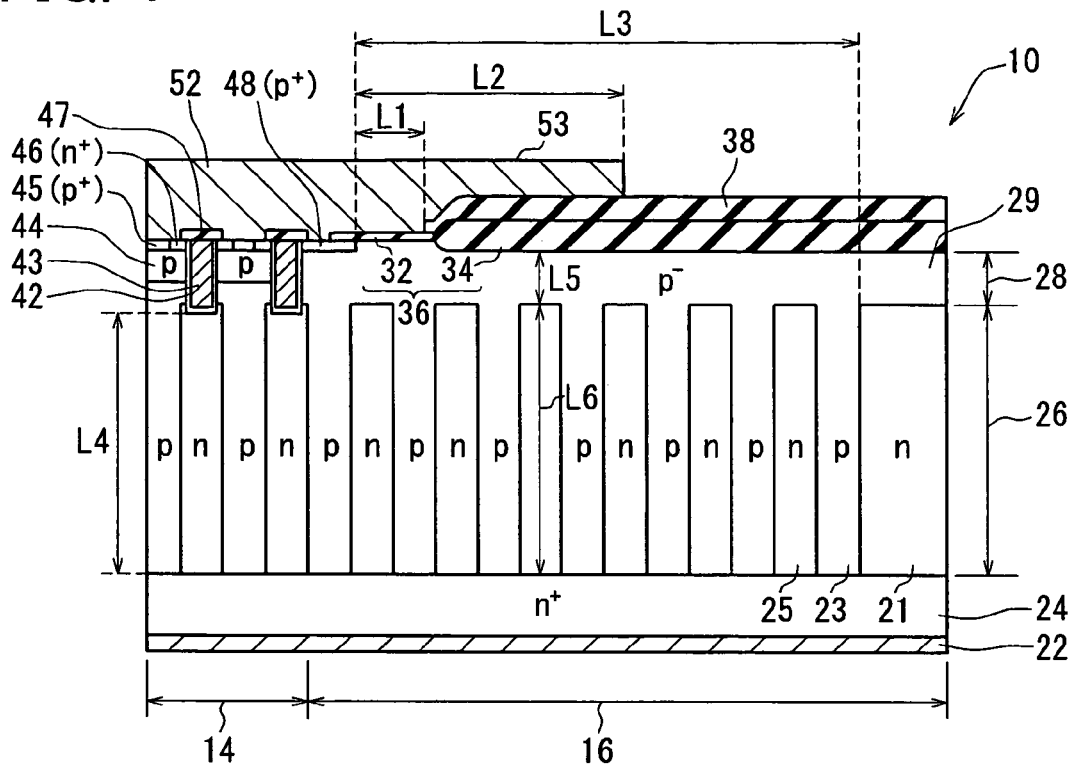
FIG. 1 is a cross sectional view showing a main part of a semiconductor device according to an embodiment of the present invention.

FIG. 1 shows a vertical section view of a relevant part near a boundary between a cell region 14 and a terminal region 16 of a semiconductor device 10.

As shown in FIG. 1, the semiconductor device 10 includes the cell region 14 in which a vertical semiconductor-switching-cell (in the example, SJ-MOSFET) group is formed, and the terminal region 16 situated in the periphery of the cell region 14. Actually, vertical semiconductor-switching-cells in the cell region 14 are repeatedly formed toward the left on paper. In FIG. 1, part of the vertical semiconductor-switching-cells located near the boundary between the cell region 14 and the terminal region 16 are shown. A planar pattern of the cell region 14 is a rectangular pattern. A planar pattern of the terminal region 16 is formed around the rectangular cell region 14.

The semiconductor device 10 includes an $n^+$-type drain layer 24 (an example of the semiconductor lower-layer) formed continuously from the cell region 14 to the terminal region 16. On a back of the drain layer 24, a drain electrode 22 made of aluminum is formed by evaporation. On a surface of the drain layer 24, a semiconductor intermediate-layer 26 is formed. In the semiconductor intermediate-layer 26, n-type columns 25 (an example of the first partial region) that extends in a thickness direction (vertical direction on paper in FIG. 1) and contains an n-type impurity, and p-type columns 23 (an example of the second partial region) that extends in the thickness direction and contains a p-type impurity are formed. A combination of the n-type column 25 and the p-type column 23 is repeatedly formed in a plane perpendicular to the thickness direction. This repeated structure is typically called super junction structure (i.e., SJ structure). When the n-type column 25 and the p-type column 23 are seen in a plane view, the n-type column 25 and the p-type column 23 are formed in a stripe pattern extending in a back direction on paper. The n-type column 25 and the p-type column 23 are substantially in a sheet shape. The combination of the sheet-shaped n-type column 25 and the sheet-shaped p-type column 23 is formed repeatedly in a left and right direction on paper, and such repetition is continued from the cell region 14 to the terminal region 16. In a circumferential side of the terminal region 16, an n-type circumferential region 21 is formed. In the circumferential region 21, for example, an isolation trench, a channel stopper region and the like are formed, which are not shown. In the semiconductor device 10, width of the n-type column 25 (meaning width in a repetition direction in the plane perpendicular to the thickness direction) and width of the p-type column 23 (same as above) are the same in both of the cell region 14 and the terminal region 16. The width of the n-type column 25 and the width of the p-type column 23 may be different in each of the cell region 14 and the terminal region 16 as necessary.

A $p^-$-type semiconductor upper-layer 28 is formed on a surface of the semiconductor intermediate-layer 26. A semiconductor upper-layer formed on a portion of the terminal region 16 in the semiconductor upper-layer 28 is called resurf layer 29 (an example of the terminal semiconductor upper-layer). Here, a resurf construction represents a reduced surface field construction. P-type body regions 44 are formed on the semiconductor upper-layer 28 in the cell region 14. An impurity concentration of the body regions 44 is adjusted such that a gate threshold value is equal to a desired value. The resurf layer 29 is formed to have uniform thickness L5 over the whole range of the terminal region 16. An impurity concentration of the resurf layer 29 is made low compared with the impurity concentrations of each of the body regions 44 as body layers and the p-type column 23. A $p^+$-type terminal contact semiconductor region 48 is formed on a surface of the resurf layer 29 in a side of the cell region 14. The terminal contact semiconductor region 48 is formed near the boundary between the cell region 14 and the terminal region 16. The terminal contact semiconductor region 48 can be regarded as a body contact region situated in an outermost circumference in body contact regions 45 (described later) formed in the cell region 14.

A field oxide film 36 (an example of the insulating film) made of silicon oxide is formed on a surface of the resurf layer 29. The field oxide film 36 is formed on the surface of the resurf layer 29 in a side opposite to the cell region side with respect to the terminal contact semiconductor region 48. The field oxide film 36 includes a thin-layer field oxide film 32 adjusted to have small thickness in the cell region side, and a thick-layer field oxide film 34 adjusted to have large thickness in the side opposite to the cell region side. A part of the thin-layer field oxide film 32 is formed on a surface of the terminal contact semiconductor region 48. Since the thick-layer field oxide film 34 is formed by using the thermal oxidation process, a part of it enters into an upper region of the resurf layer 29. A terminal-side interlayer insulating film 38 is formed on a surface of the thick-layer field oxide film 34. The insulating layer is formed thick by totaling the thick-layer field oxide film 34 and the terminal-side interlayer insulating film 38. By providing the terminal-side interlayer insulating film 38, total thickness of the thick-layer field oxide film 34 and the terminal-side interlayer insulating film 38 can be made large compared with thickness of the thin-layer field oxide film 32. Thus, large difference can be easily established between the thickness of the thin-layer field oxide film 32 and the thickness of the thick-layer field oxide film 34 and the terminal-side interlayer insulating film 38.

A field plate 53 (an example of the conductive layer) is formed on a surface of the thin-layer field oxide film 32 and a surface of a part of the terminal-side interlayer insulating film 38. The field plate 53 is a source electrode 52 extending from the cell region 14 to the side opposite to the cell region on the terminal region 16. The field-plate 53 extends from a portion on the surface of the terminal contact semiconductor region 48 to the surface of a part of the terminal-side interlayer insulating film 38 beyond the thin-layer field oxide film 32.

Next, a structure of the cell region 14 is described. N+-type source region 46 and p+-type body contact regions 45 are selectively formed on a surface of the body regions 44. Trench gate electrodes 43 made of poly silicon are formed through the body regions 44 and the semiconductor upper-layer 28, both of which isolate between the source regions 46 and the n-type columns 25. The trench gate electrodes 43 are covered with a gate insulating films 42 made of silicon oxide. The trench gate electrodes 43 are formed along a longitudinal direction of the n-type columns 25, whose planar pattern is a stripe pattern. The source regions 46, body contact regions 45, and terminal contact semiconductor region 48 are electrically connected to the source electrode 52. The source electrode 52 and the trench gate electrodes 43 are electrically isolated from each other by an interlayer insulating films 47 made of silicon oxide.

The boundary between the cell region 14 and the terminal region 16 is defined as a bonding surface between an n-type column 25 contacting to a trench gate electrode 43 at an outermost circumference and a p-type column adjacent to the n-type column.

Next, operation when the semiconductor device 10 is turned off is described.

In the semiconductor device 10, the resurf layer 29 is provided on the surface of the semiconductor intermediate-layer 26 in the terminal region 16. Since the resurf layer 29 is adjusted to be low in an impurity concentration, when the semiconductor device 10 is turned off, a depletion layer expands from the terminal contact semiconductor region 48 and the p-type columns 23 to the resurf layer 29. At that time, since the field plate 53 is provided, the depletion layer in the resurf layer 29 can extend widely to the side opposite to the cell side. Thus, potential line distribution in the upper region of the resurf layer 29 is formed with regular intervals from the cell region 14 side to the side opposite to the cell region side. Furthermore, since the thin-layer field oxide film 32 is provided, even in the portion near the boundary between the cell region 14 and the terminal region 16 where the potential line distribution tends to be dense, the potential line distribution can be made relatively thin, and consequently the local concentration of the electric field can be reduced. Advantages of providing the thin-layer field oxide film 32 and the thick-layer field oxide film 34 can be explained as follows. If the thin-layer field oxide film 32 is formed uniformly on the surface of the resurf layer 29, the potential line distribution becomes dense at a portion directly below an end in the side opposite to the cell region side of the field plate 53, resulting in excessive electric-field concentration. If the thin-layer field oxide film 32 is not formed, the potential line distribution becomes dense in the portion near the boundary between the cell region 14 and the terminal region 16, resulting in excessive electric-field concentration. By combining the thin-layer field oxide film 32 and the thick-layer field oxide film 34, the local concentration of the electric field can be reduced over a wide area of the resurf layer 29. Furthermore, since the thick-layer field oxide film 34 is formed by using the thermal oxidation process, it partially enters into the upper region of the resurf layer 29. Thus, height in the thickness direction of the resurf layer 29 situated directly below the thin-layer field oxide film 32 is large compared with height in the thickness direction of the resurf layer 29 situated directly below the thick-layer field oxide film 34. Thus, the local concentration of the electric field is reduced more significantly in a portion directly below the thin-layer field oxide film 32.

When the local concentration of electric field is improved, withstanding voltage of the cell region 14 and withstanding voltage of the terminal region 16 are mainly determined by height in the thickness direction of the depleted region formed in each of the regions. Thickness of the depleted region in the cell region 14 is height L4 from a bottom of the trench gate electrode 43 to the drain layer 24. Thickness of the depleted region in the terminal region 16 is in a size of adding thickness L6 of the semiconductor intermediate layer 26 to thickness L5 of the resurf layer 29. The thickness of the depleted region of the terminal region 16 is larger than that of the depleted region of the cell region 14. Therefore, withstanding voltage of the terminal region 16 is larger than that of the cell region 14.

Thus, the local concentration of the electric field near the terminal contact semiconductor region 48 is reduced, and the height in the thickness direction of the depleted region in the terminal region 16 is made larger than that of the depleted region in the cell region 14, thereby the withstanding voltage of the terminal region 16 is larger than that of the cell region 14.

Figure 2:
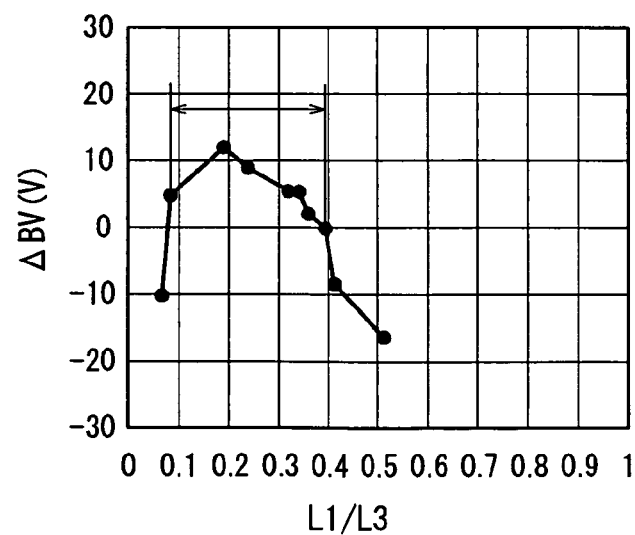
FIG. 2 is a graph showing a relationship between a ratio of L1/L3 and a withstand voltage of a terminal region.
Figure 3:
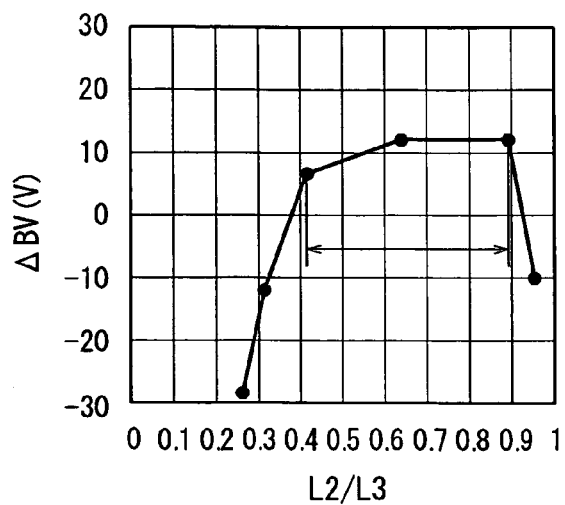
FIG. 3 is a graph showing a relationship between a ratio of L2/L3 and the withstand voltage of the terminal region.
Figure 4:
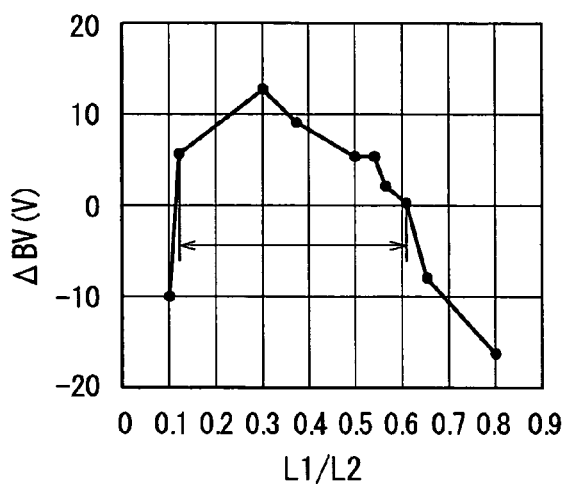
FIG. 4 is a graph showing a relationship between a ratio of L1/L2 and the withstand voltage of the terminal region.

FIGS. 2 to 4 show variation in withstanding voltage of the terminal region 16 when length L1 of the thin-layer field oxide film 32, length L2 of the field plate 53, and length L3 of the SJ structure of the terminal region 16 are changed for adjustment.

Here, as shown in FIG. 1, the length L1 of the thin-layer field oxide film 32 is length from the end at the side opposite to the cell region side of the terminal contact semiconductor region 48 to the end at the side opposite to the cell region side of the thin-layer field oxide film 32. The length L2 of the field plate 53 is length from the end at the side opposite to the cell region side of the terminal contact semiconductor region 48 to the end at the side opposite to the cell region side of the field plate 53. The length L3 of the SJ structure of the terminal region 16 is length from the end at the side opposite to the cell region side of the terminal contact semiconductor region 48 to the end at the side opposite to the cell region side of the p-type column 23 situated at the outermost circumference in the columns configuring the super junction structure provided in the terminal region 16. Each of the length L1, L2 and L3 is length measured in a direction perpendicular to the thickness direction. When the withstanding voltage is 200 V, the length L3 of the SJ structure of the terminal region 16 is approximately 50 μm, thickness L4 of the semiconductor intermediate layer 26 is approximately 12 μm, and thickness L5 of the resurf layer 29 is approximately 3 μm.

FIG. 2 shows variation in withstanding voltage of the terminal region 16 when a ratio of the length L1 of the thin-layer field oxide film 32 to the length L3 of the SJ structure of the terminal region 16 is changed. A horizontal axis shows L1/L3, and a vertical axis shows an increase-and-decrease level of subtracting the withstanding voltage of the cell region 14 from the withstanding voltage of the terminal region 16. When ΔBV is positive, it means a condition that the terminal region 16 has high withstanding voltage compared with the cell region 14. While this result is a result when the length L2 of the field plate 53 is fixed to 0.64 to the length L3 of the SJ structure of the terminal region 16, even if a value other than the fixed value is used, the same result is obtained.

As shown in FIG. 2, when the length L1 of the thin-layer field oxide film 32 is within a range of 0.08 to 0.39 to the length L3 of the SJ structure of the terminal region 16, a condition that the withstanding voltage of the terminal region 16 is higher than the withstanding voltage of the cell region 14 is obtained. More preferably, L1/L3 is within a range of 0.15 to 0.23. In this case, the withstanding voltage of the terminal region 16 is at least 10 V higher than the withstanding voltage of the cell region 14. When the avalanche resistance check is performed, breakdown can be induced dominantly in the cell region 14 rather than in the terminal region 16.

FIG. 3 shows variation in withstanding voltage of the terminal region 16 when a ratio of the length L2 of the field plate 53 to the length L3 of the SJ structure of the terminal region 16 is changed. A horizontal axis shows L2/L3, and a vertical axis shows an increase-and-decrease level of subtracting the withstanding voltage of the cell region 14 from the withstanding voltage of the terminal region 16. While this result is a result when the length L1 of the thin-layer field oxide film 32 is fixed to 0.2 to the length L3 of the SJ structure of the terminal region 16, even if a value other than the fixed value is used, the same result is obtained.

As shown in FIG. 3, when the length L2 of the field plate 53 is within a range of 0.41 to 0.9 to the length L3 of the SJ structure of the terminal region 16, a condition that the withstanding voltage of the terminal region 16 is higher than the withstanding voltage of the cell region 14 is obtained. More preferably, L2/L3 is within a range of 0.55 to 0.9. In this case, the withstanding voltage of the terminal region 16 is at least 10 V higher than the withstanding voltage of the cell region 14. When the avalanche resistance check is performed, breakdown can be induced dominantly in the cell region 14 rather than in the terminal region 16.

FIG. 4 shows variation in withstanding voltage of the terminal region 16 when a ratio of the length L1 of the thin-layer field oxide film 32 to the length L2 of the field plate 53 is changed. A horizontal axis shows L1/L2, and a vertical axis shows an increase-and-decrease level of subtracting the withstanding voltage of the cell region 14 from the withstanding voltage of the terminal region 16. While this result is a result when the length L2 of the field plate 53 is fixed to 0.64 to the length L3 of the SJ structure of the terminal region 16, even if a value other than the fixed value is used, the same result is obtained.

As shown in FIG. 4, when the length L1 of the thin-layer field oxide film 32 is within a range of 0.13 to 0.61 to the length L2 of the field plate 53 in the terminal region 16, a condition that the withstanding voltage of the terminal region 16 is higher than the withstanding voltage of the cell region 14 is obtained. More preferably, L1/L2 is within a range of 0.25 to 0.35. In this case, the withstanding voltage of the terminal region 16 is at least 10 V higher than the withstanding voltage of the cell region 14. When the avalanche resistance check is performed, breakdown can be induced dominantly in the cell region 14 rather than in the terminal region 16.

Next, a manufacturing method of the semiconductor device 10 is described with reference to FIGS. 5 to 14.

Figure 5:
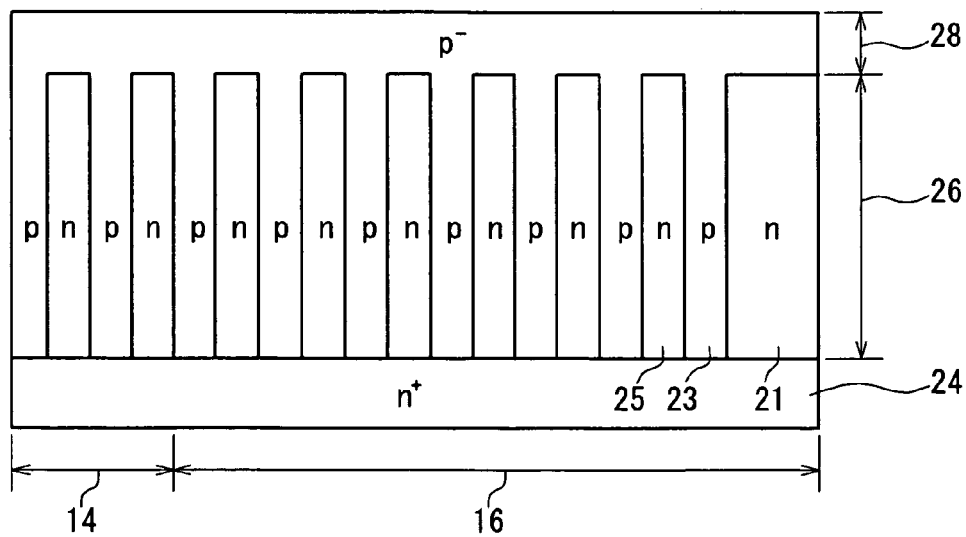
FIGS. 5 to 14 are cross sectional views explaining a method for manufacturing the device.

First, as shown in FIG. 5, a semiconductor stack is prepared, in which the drain layer 24, semiconductor intermediate layer 26 and semiconductor upper-layer 28 are stacked. The SJ structure of the semiconductor intermediate layer 26 can be obtained, for example, by forming a trench group in an n-type semiconductor layer by using anisotropic dry etching such as RIE (Reactive Ion Etching), and then advancing embedded epitaxial growth of the p-type columns 23. The remainder after the trench group has been produced is the n-type columns 25. A multi-epitaxial process, an oblique ion implantation process and the like may be used instead of the embedded epitaxial growth, or a combination of them may be used for forming the SJ structure.

The semiconductor upper-layer 28 can be formed on a surface of the semiconductor intermediate layer 26 having the SJ structure formed therein by using an epitaxial growth process.

Figure 6:
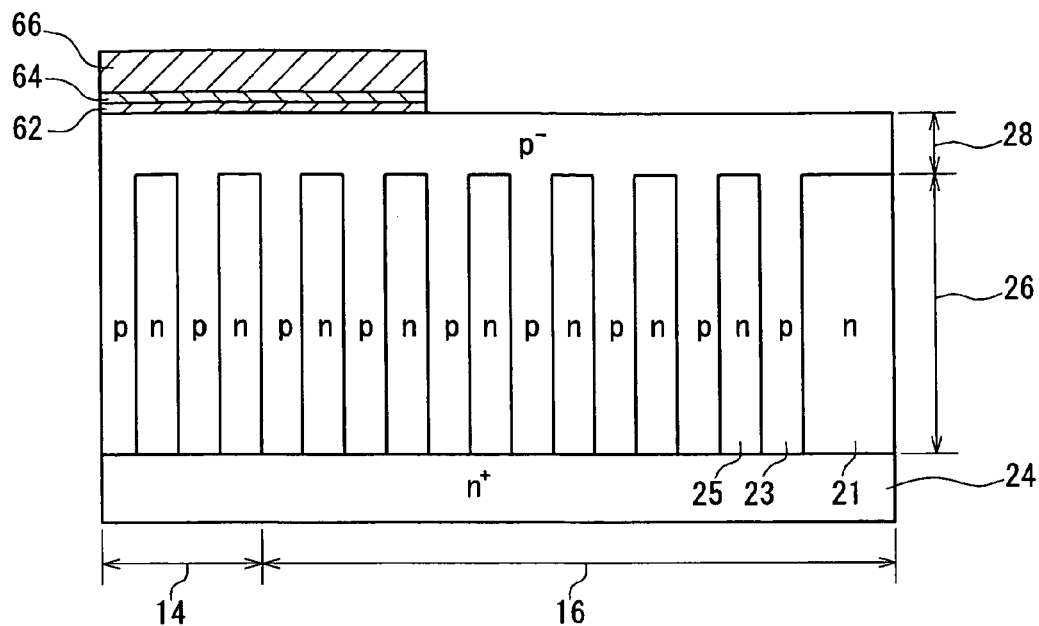

Next, as shown in FIG. 6, a silicon oxide film 62 and a silicon nitride film 64 are formed on a surface of the semiconductor upper-layer 28, and then a resist layer 66 is formed on a surface of the silicon nitride film 64 in a portion corresponding to the cell region 14 and the thin-layer field oxide film 32 to be completed, and then the silicon oxide film 62 and the silicon nitride film 64 as the remainder are removed. After removal of the silicon oxide film 62 and the silicon nitride film 64 has been completed, the resist layer 66 is removed.

Figure 7:
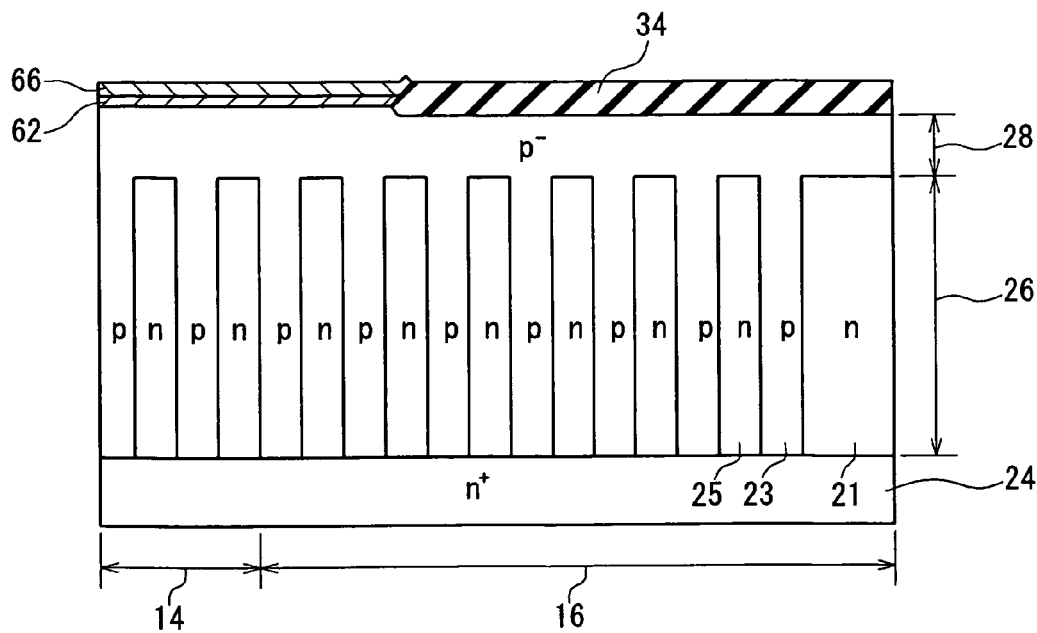

Then, as shown in FIG. 7, a thick-layer field oxide film 34 is formed on a surface of an exposed semiconductor upper-layer 28 by using the thermal oxidation process.

Figure 8:
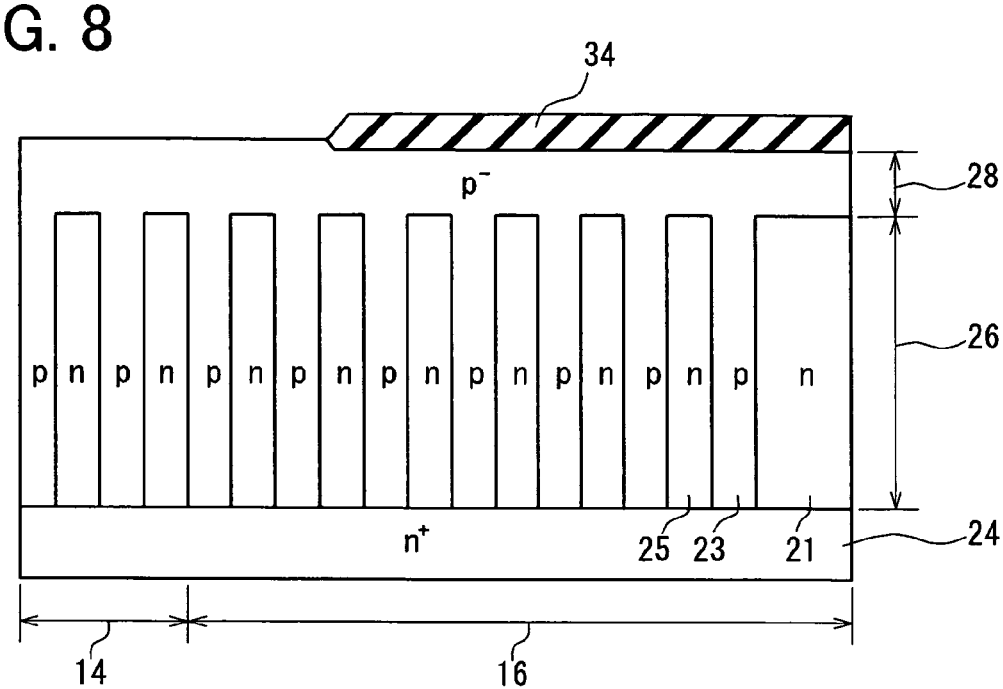

Then, as shown in FIG. 8, the silicon oxide film 62 and the silicon nitride film 64 are removed by using an etching technique.

Figure 9:
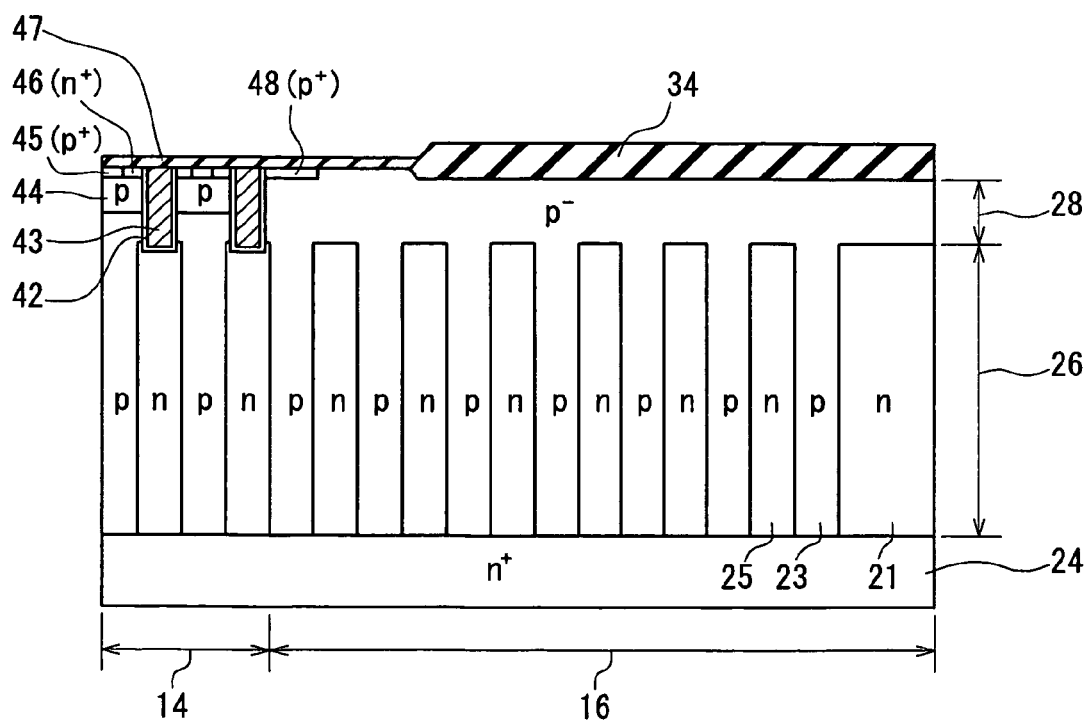

Then, as shown in FIG. 9, a semiconductor-switching-cell group is formed in the cell region 14. Specifically, the body regions 44, source regions 46, body contact regions 45, and terminal body contact semiconductor region 48 are formed by using an ion implantation technique. Then, trenches that reach to the n-type columns 25 through the source regions 46, body regions 44 and semiconductor upper-layer 28 are formed by using the RIE process and the like. Inner walls of the trenches are covered by the gate insulating films 42 made of silicon oxide films, and then the trench gate electrodes 43 made of polysilicon are filled in the trenches.

Figure 10:
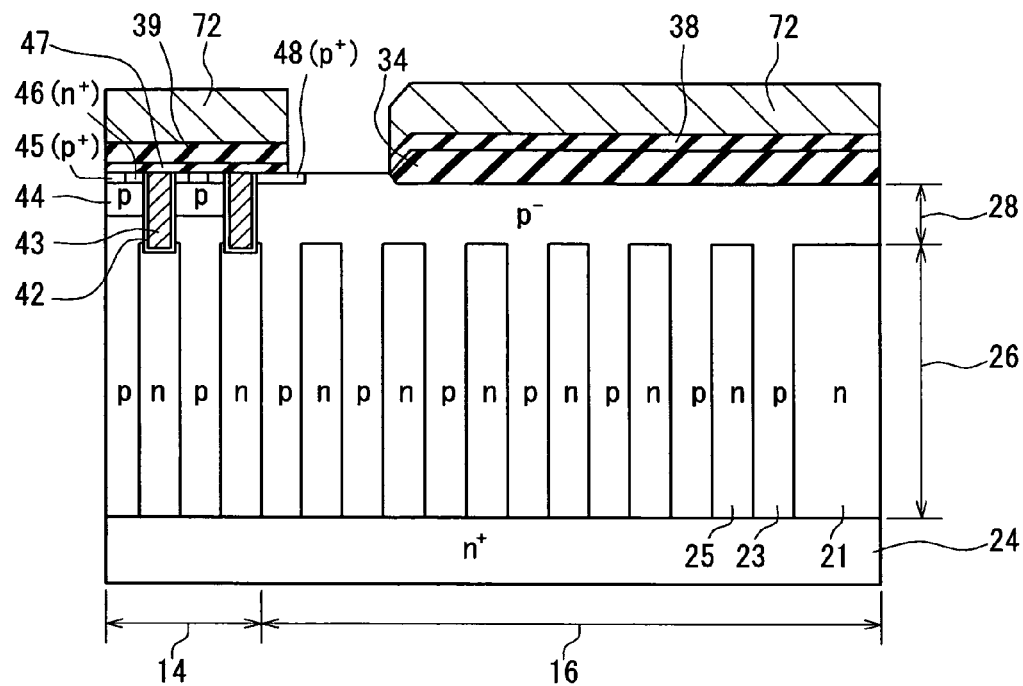

Then, the first interlayer insulating film 47 is formed on the surface of the semiconductor upper-layer 28 corresponding to the cell region 14 by using the CVD (Chemical Vapor Deposition) process or the thermal oxidation process. Furthermore, as shown in FIG. 10, second interlayer insulating films 38, 39 are formed on surfaces of the first interlayer insulating film 47 and the thick-layer field oxide film 34 by using the CVD process. A resist layer 72 is formed on surfaces of the second interlayer insulating films 38, 39, and then an interlayer insulating film 47 and second interlayer insulating films 38, 39 in a portion corresponding to a thin-layer field oxide film 32 to be completed are selectively removed. A second interlayer insulating film in the cell region 14 side is shown by a reference numeral 39, and a second interlayer insulating film in the terminal region 16 side is shown by a reference numeral 38.

Figure 11:
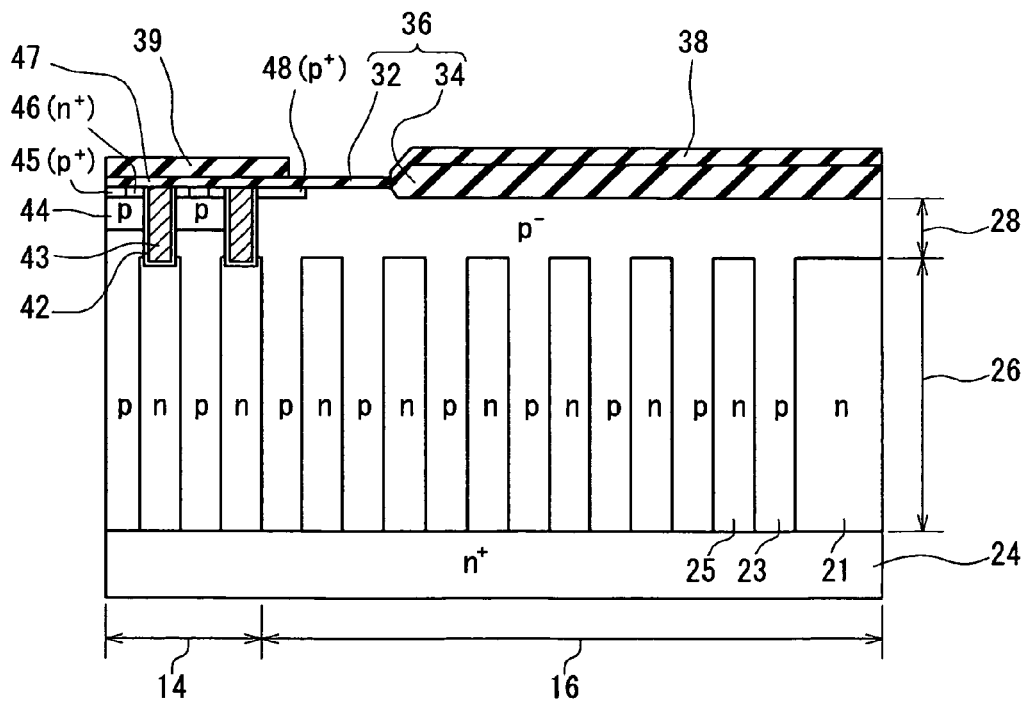

Then, as shown in FIG. 11, the resist layer 72 is removed, and then the thin-layer field oxide film 32 is formed on a surface of an exposed semiconductor upper-layer 28 by using the CVD process. Thus, the field oxide film 36 is formed, which has the thin-layer field oxide film 32 adjusted to be thin in the cell region 14 side and the thick-layer field oxide film 34 adjusted to be thick in the side opposite to the cell region side.

Figure 12:
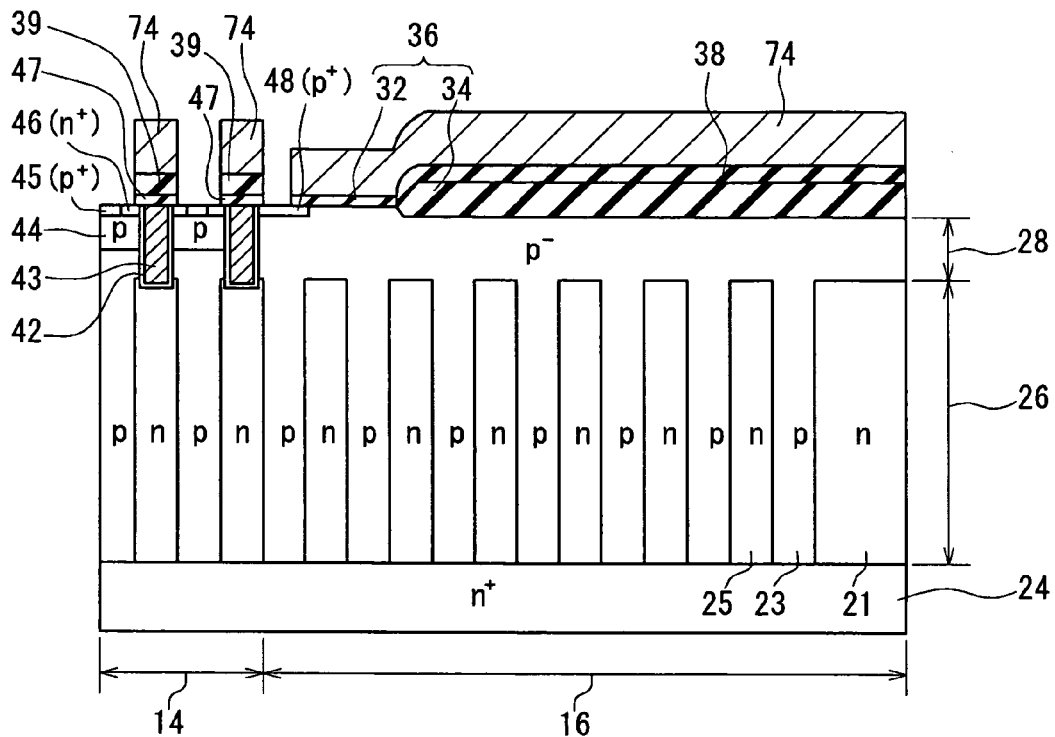

Then, as shown in FIG. 12, by using the resist layer 74 the interlayer insulating film 47 and the second interlayer insulating film 39 are partially removed, so that the source regions 46, body contact regions 45, and terminal contact semiconductor region 48 are exposed.

Figure 13:
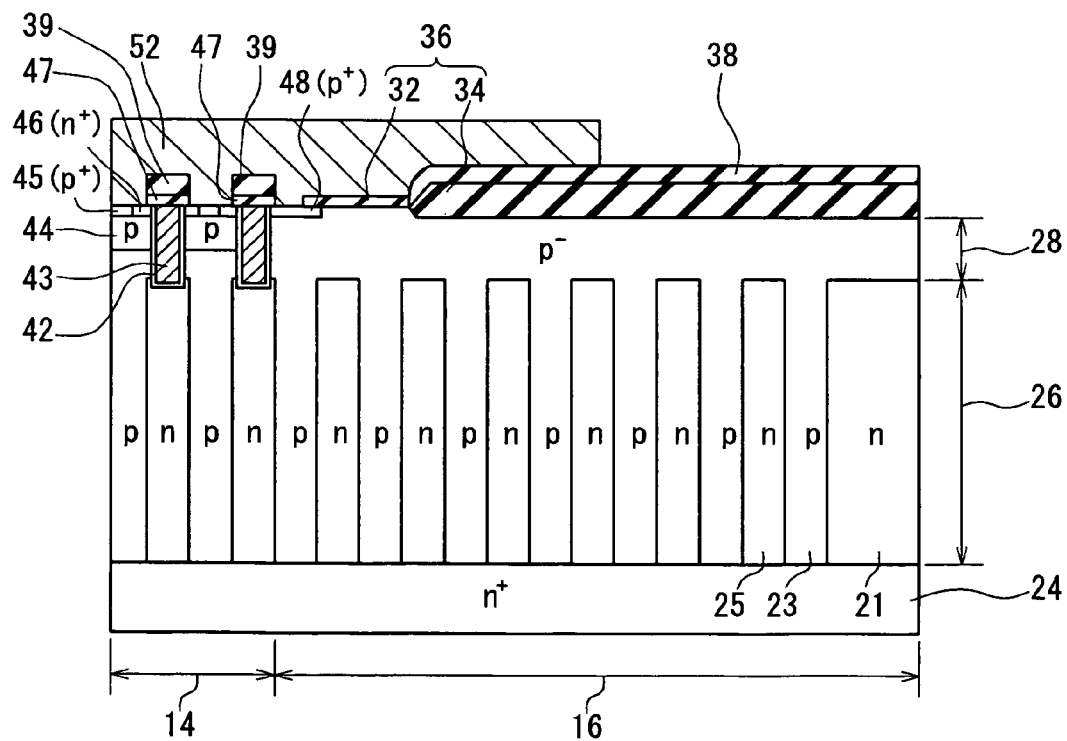

Then, as shown in FIG. 13, the resist layer 74 is removed, and then the source electrode 52 made of aluminum is formed on the surface of the cell region 14 to be electrically connected to the source regions 46, body contact region 45, and terminal contact semiconductor region 48. The source electrode 52 is also formed on surfaces of the thin-layer field oxide film 32 and a part of the second interlayer insulating film 38 from the cell region 14 side to the side opposite to the cell region side.

Figure 14:
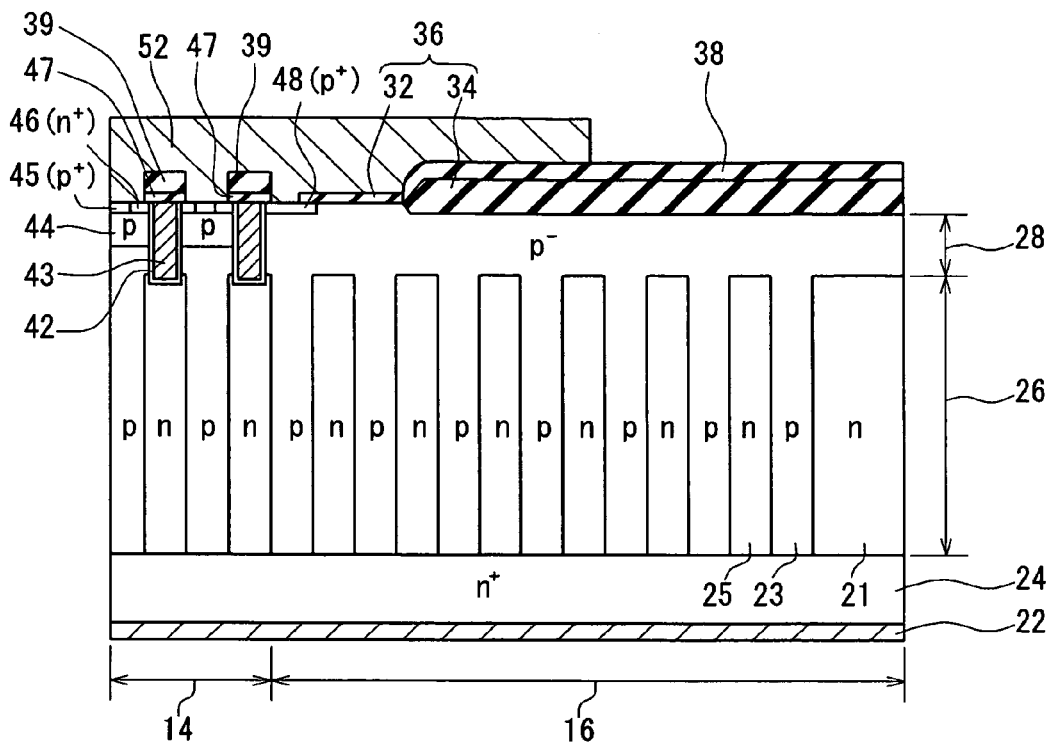

Finally, as shown in FIG. 14, the drain electrode 22 is formed by evaporating aluminum on the back of the drain layer 24. The semiconductor device 10 as show in FIG. 1 can be obtained via the steps.

Figure 15:
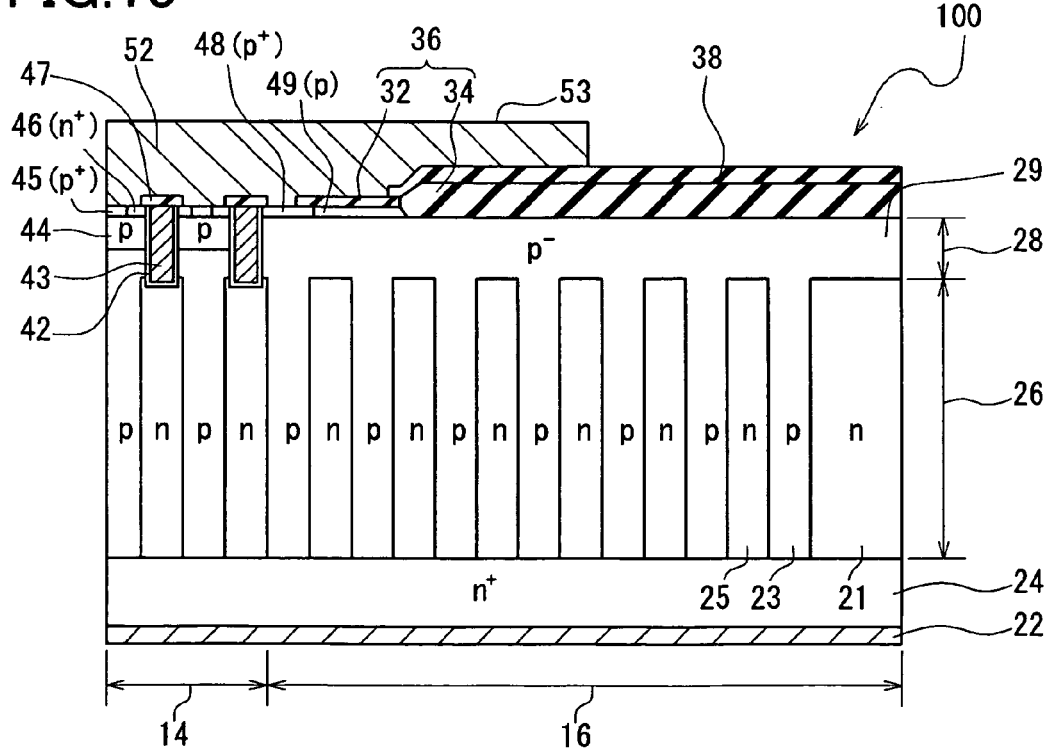
FIG. 15 is a cross sectional view showing a main part of a semiconductor device according to a modification of the embodiment of the present invention.

FIG. 15 shows a cross section view of a relevant part of a semiconductor device 100 as a modification of the first embodiment. Substantially identical components are marked with identical reference numerals, and omitted to be described.

In the semiconductor device 100, a p-type semiconductor region 49 is provided on the semiconductor upper-layer 28 directly below the thin-layer field oxide film 32 in addition to the components of the semiconductor device 10. The semiconductor region 49 is contacted to the terminal contact semiconductor region 48. An impurity concentration of the semiconductor region 49 is adjusted to be low compared with the impurity concentration of the terminal contact semiconductor region 48, and high compared with the impurity concentration of the semiconductor upper-layer 28.

The semiconductor region 49 can effectively reduce the electric field concentrated near the boundary between the cell region 14 and the terminal region 16. The semiconductor region 49 having an intermediate impurity concentration between the impurity concentration of the terminal contact semiconductor region 48 and the impurity concentration of the semiconductor upper-layer 28 is provided, thereby an electric field that particularly tends to be concentrated in a large curvature portion in end faces of the terminal contact semiconductor region 48 can be reduced. The multiplication effect of the semiconductor region 49 and the field plate 53 can expand the potential line distribution, which is dense on the end face having the large curvature of the terminal contact semiconductor region 48, to the side opposite to the cell region side. Furthermore, the semiconductor device 100 has an extremely large effect of reducing the electric field near the boundary between the cell region 14 and the terminal region 16 because the thin-layer field oxide film 32 is combined with the semiconductor region 49.

The thin-layer field oxide film 32 and the semiconductor region 49 have equivalent operation and effects in that they reduce the electric field. Therefore, if one of structures of them is provided, the effect of reducing local concentration of the electric field can be obtained.

The semiconductor region 49 is preferably formed in contact with the end face having the large curvature of the terminal contact semiconductor region 48. Thus, a phenomenon of reducing local concentration of the electric field can be effectively provided. For example, the semiconductor region 49 may be formed in contact with a part of the end face of the terminal contact semiconductor region 48, or may be formed enclosing the terminal contact semiconductor region 48.

While specific embodiments of the invention have been described in detail hereinbefore, they are illustrative only, and are not intended to limit claims. The techniques include various modifications and alterations of the above exemplified specific embodiments.

Moreover, the technology components described in the specification or drawings may exhibit technical usefulness independently or in various combinations, and are not limited to combinations. Moreover, the techniques exemplified in the specification or drawings may achieve a plurality of purposes at the same time, and may have the technical usefulness by achieving one of the purposes in itself.

Embodiments of the invention are realized by a semiconductor device having a cell region in which a vertical semiconductor-switching-cell group is formed and a terminal region situated in the periphery of the cell region.

A semiconductor device created by the embodiments of the invention includes a semiconductor lower-layer containing an impurity in a first conduction type, a semiconductor intermediate-layer formed on a surface of the semiconductor lower-layer, and a terminal semiconductor upper-layer that is formed on a surface of the semiconductor intermediate-layer in the terminal region and contains an impurity in a second conduction type in a low concentration. In the semiconductor intermediate-layer, a super junction structure is formed, in which a combination of a first partial region that extends in a thickness direction and contains the impurity in the first conduction type and a second partial region that extends in the thickness direction and contains the impurity in the second conduction type is repeated in a plane perpendicular to the thickness direction.

The semiconductor device of the embodiments further includes a terminal contact semiconductor region that is formed on a surface in the cell region side of the terminal semiconductor upper-layer and contains the impurity in the second conduction type in a high concentration. In addition, the device includes a combined structure of an insulating layer and a conductive layer. The insulating layer is formed on a surface of the terminal semiconductor upper-layer in a side opposite to the cell region side with respect to the terminal contact semiconductor region, and adjusted to have small thickness in the cell region side and have large thickness in the side opposite to the cell region side. The conductive layer extends from a portion on a surface of the terminal contact semiconductor region to a portion on a surface of the insulating layer adjusted to be thick beyond the insulating layer adjusted to be thin.

The first and second partial regions are, for example, in a sheet shape, square pole shape, or hexagonal column shape. Alternatively, columnar, second partial regions may be dispersedly disposed in the first partial region that extends wide in the plane perpendicular to the thickness direction. In a word, the combination of the first and second partial regions can be repeated in at least one direction in the plane perpendicular to the thickness direction.

A type of the vertical semiconductor switching cell formed in the cell region is not particularly limited. For example, a vertical semiconductor switching cell of MOS-FET, IGBT, SIT (Static Induction Transistor), SBT (Shottky Barrier Diode) or the like can be given. As a gate electrode structure provided in the vertical semiconductor switching cell, a trench type, a planar type, or other structures can be used.

In the semiconductor device in the above aspect, the terminal semiconductor upper-layer is provided on the surface of the semiconductor intermediate-layer in the terminal region. Since the impurity concentration of the terminal semiconductor upper-layer is adjusted to be low, when the semiconductor device is turned off, the depletion layer expands even to the terminal semiconductor upper-layer. Therefore, a depleted region in the terminal region becomes large in height in the thickness direction compared with a depleted region in the cell region depending on thickness of the terminal semiconductor upper-layer. While depending on a structure of the semiconductor switching element in the cell region, the depleted region in the terminal region can be made large in height in the thickness direction compared with the depleted region in the cell region by adjusting thickness of the terminal semiconductor upper-layer. Accordingly, withstanding voltage in the terminal region becomes high compared with that in the cell region. Furthermore, thickness of the insulating layer provided on the surface of the terminal semiconductor upper-layer is adjusted to be smaller in a side of the terminal contact semiconductor region. Furthermore, the conductive layer is provided on a surface of the thin insulating layer. Therefore, local concentration of the electric field near the terminal contact semiconductor region is reduced.

Thus, the local concentration of electric field near the terminal contact semiconductor region can be reduced, and height in the thickness direction of the depleted region in the terminal region can be made large compared with the cell region. Thus, in the semiconductor device in the above aspect, withstanding voltage of the terminal region is high compared with the cell region.

Length from an end at a side opposite to the cell region side of the terminal contact semiconductor region to an end at a side opposite to the cell region side of the insulating layer that has been adjusted to be thin is preferably within a range of 0.08 to 0.39 times length from the end at the side opposite to the cell region side of the terminal contact semiconductor region to an end at a side opposite to the cell region side of the super junction structure in the terminal region. The "end at the side opposite to the cell region side of the super junction structure in the terminal region" means an end at the side opposite to the cell region side of a partial region situated at the outermost circumference in partial regions configuring the super junction structure.

It is verified by study of the inventors that when the insulating layer that has been adjusted to be thin is formed with the above numeric range, withstanding voltage of the terminal region is high compared with the cell region.

Length from the end at the side opposite to the cell region side of the terminal contact semiconductor region to an end at the side opposite to the cell region side of the conductive layer is preferably within a range of 0.41 to 0.9 times length from the end at the side opposite to the cell region side of the terminal contact semiconductor region to the end at the side opposite to the cell region side of the super junction structure in the terminal region.

It is verified by study of the inventors that when the conductive layer is formed with the above numeric range, withstanding voltage of the terminal region is high compared with the cell region.

Length from the end at the side opposite to the cell region side of the terminal contact semiconductor region to the end at the side opposite to the cell region side of the insulating layer that has been adjusted to be thin is preferably within a range of 0.13 to 0.61 times length from the end at the side opposite to the cell region side of the terminal contact semiconductor region to the end at the side opposite to the cell region side of the conductive layer.

It is verified by study of the inventors that when the insulating layer that has been adjusted to be thin and the conductive layer are formed in a relationship with the above numeric range, withstanding voltage of the terminal region is high compared with the cell region.

A semiconductor region is preferably formed, which is contacted to the terminal contact semiconductor region, and contains an impurity in a second conduction type having a concentration adjusted to be low compared with the impurity concentration of the terminal contact semiconductor region and high compared with the impurity concentration of the terminal semiconductor upper-layer.

A portion near the boundary between the cell region and the terminal region is a portion where the local concentration of the electric field tends to occur. Therefore, when the semiconductor region adjusted to be in the above concentration range is provided corresponding to the portion, the local concentration of the electric field can be significantly reduced. Thus, since the breakdown of the semiconductor device due to the local concentration of the electric field can be avoided, withstanding voltage of the terminal region and that of the cell region are determined mainly by height in the thickness direction of depleted regions formed in both. The embodiments of the invention use a structure in which the terminal semiconductor upper-layer is provided on the surface of the semiconductor intermediate layer in the terminal region, thereby the depleted region in the terminal region is larger than that of the cell region. Accordingly, the withstanding voltage of the terminal region is secured to be higher than that of the cell region.

The insulating layer having a small thickness portion and a large thickness portion is not essential for reduction of the local concentration of the electric field near the boundary between the cell region and the terminal region. For example, if the semiconductor region is provided, which is contacted to the terminal contact semiconductor region, and contains the impurity in the second conduction type having a concentration adjusted to be low compared with the impurity concentration of the terminal contact semiconductor region and high compared with the impurity concentration of the terminal semiconductor upper-layer, the insulating layer having adjusted thickness may not been provided. While both of the semiconductor region having the adjusted concentration and the insulating layer having the adjusted thickness are preferably provided, even if only the former is provided, it is useful for reducing the local concentration of the electric field in many cases.

That is, another semiconductor device created by the embodiments of the invention includes a semiconductor lower-layer containing an impurity in a first conduction type, a semiconductor intermediate-layer formed on a surface of the semiconductor lower-layer, and a terminal semiconductor upper-layer that is formed on a surface of the semiconductor intermediate-layer in the terminal region and contains an impurity in a second conduction type in a low concentration. In the semiconductor intermediate-layer, a super junction structure is formed, in which a combination of a first partial region that extends in a thickness direction and contains the impurity in the first conduction type and a second partial region that extends in the thickness direction and contains the impurity in the second conduction type is repeated in a plane perpendicular to the thickness direction.

The semiconductor device of the embodiments further includes a terminal contact semiconductor region that is formed on a surface in the cell region side of the terminal semiconductor upper-layer and contains the impurity in the second conduction type in a high concentration, and a semiconductor region that is contacted to the terminal contact semiconductor region, and contains the impurity in the second conduction type adjusted to be less concentrated compared with the impurity concentration of the terminal contact semiconductor region and more concentrated compared with the impurity concentration of the terminal semiconductor upper-layer. The semiconductor device of the embodiments of the invention further includes a combined structure of an insulating layer and a conductive layer. The insulating layer is formed on a surface of the terminal semiconductor upper-layer in a side opposite to the cell region side with respect to the terminal contact semiconductor region. The conductive layer extends from a portion on a surface of the terminal contact semiconductor region to a portion on a surface of the insulating layer.

The inventors created a new semiconductor device, and accordingly created a new manufacturing method of the semiconductor device.

That is, the manufacturing method of the semiconductor device created in the embodiments of the invention can be used for a semiconductor device having a cell region in which a vertical semiconductor-switching-cell group is formed and a terminal region situated in the periphery of the cell region.

The manufacturing method of the semiconductor device of the embodiments of the invention includes a step of preparing the semiconductor stack in which the semiconductor lower-layer containing the impurity in the first conduction type, the semiconductor intermediate-layer, and the terminal semiconductor upper-layer that contains the impurity in the second conduction type in the low concentration are stacked. The semiconductor intermediate-layer has a super junction structure in which the combination of the first partial region that extends in the thickness direction and contains the impurity in the first conduction type and the second partial region that extends in the thickness direction and contains the impurity in the second conduction type is repeated in the plane perpendicular to the thickness direction.

The manufacturing method of the semiconductor device of the embodiments further includes a step of forming the terminal contact semiconductor region containing the impurity in the second conduction type in the high concentration on the semiconductor upper-layer in the terminal region, a step of forming the thin insulating layer on the surface of the semiconductor upper-layer in the side opposite to the cell region side with respect to the terminal contact semiconductor region, and a step of forming the thick insulating layer on the surface of the semiconductor upper-layer in the side opposite to the cell region side with respect to the thin insulating layer. The manufacturing method of the semiconductor device of the embodiments of the invention still further includes a step of forming the conductive layer partially on surfaces of the terminal contact semiconductor region, thin insulating layer, and thick insulating layer.

In the manufacturing method, both the thin insulating layer and the thick insulating layer may be formed by using a thermal oxidation process. Alternatively, the thin insulating layer and the thick insulating layer may be appropriately formed by appropriately using a CVD (Chemical Vapor Deposition) process and the thermal oxidation process. In the manufacturing method, the step of forming the thin insulating layer and the step of forming the thick insulating layer are carried out, thereby thickness of the insulating layer formed on the surface of the semiconductor upper-layer can be varied with place. Thus, the semiconductor device of the embodiments can be obtained.

According to the embodiments, the local concentration of the electric field near the boundary between the terminal region and the cell region can be reduced, and concurrently with this, height in the thickness direction of the depleted region in the terminal region can be made large compared with height in the thickness direction of the depleted region in the cell region, and consequently a semiconductor device having a relationship of "withstanding voltage of the terminal region>withstanding voltage of the cell region" can be provided. Thus, a semiconductor device that is hardly broken can be realized.

Major features of embodiments are listed.

According to a first feature, a gate structure of the semiconductor switching element in the cell region is preferably in the trench type. In this case, a resurf layer is provided in the terminal region, thereby height in the thickness direction of the depleted region in the terminal region can be significantly increased compared with the depleted region in the cell region.

According to a second feature, a thick insulating layer formed on a surface of the resurf layer in the terminal region is preferably formed by using the thermal oxidation process. When the thermal oxidation process is used, a part of an insulating layer to be formed enters into an upper region of the resurf layer. Thus, height in the thickness direction of the resurf layer situated directly below the thin insulating layer becomes large compared with height in the thickness direction of the resurf layer situated directly below the thick insulating layer. Thus, local concentration of the electric field is significantly reduced in a portion directly below the thin insulating layer.

Accordingly, to a third feature, the thick insulating layer formed on the surface of the resurf layer in the terminal region is preferably a combination of two insulating layers. Thus, difference in thickness between the thin insulating layer and the thick insulating layer is easily adjusted.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
   a cell region including a plurality of semiconductor switching cells;
   a terminal region disposed around the cell region;
   a lower semiconductor layer having a first conductive type;
   an intermediate semiconductor layer disposed on the lower semiconductor layer, wherein the intermediate semiconductor layer includes a super junction structure, in which a first region having the first conductive type and a second region having a second conductive type are repeatedly arranged in a horizontal direction perpendicular to a thickness direction of the intermediate semiconductor layer, and wherein the first region extends in the thickness direction of the intermediate semiconductor layer, and the second region extends in the thickness direction of the intermediate semiconductor layer;

a terminal upper semiconductor layer disposed on the intermediate semiconductor layer in the terminal region, wherein the terminal upper semiconductor layer has the second conductive type and a low impurity concentration;

a terminal contact semiconductor region disposed on a surface portion of the terminal upper semiconductor layer in the terminal region, wherein the terminal contact semiconductor region is disposed adjacent to the cell region, and wherein the terminal contact semiconductor region has the second conductive type and a high impurity concentration;

an insulation layer disposed on the terminal upper semiconductor layer in the terminal region, wherein the insulation layer has first and second parts, the first part which is disposed adjacent to the cell region and has a small thickness, and the second part which is disposed adjacent to the first part of the insulation layer and has a large thickness, and wherein the first part of the insulation layer is disposed on the terminal contact semiconductor region and on a part of the terminal upper semiconductor layer; and a conductive layer disposed in the cell region and a part of the terminal region, wherein the conductive layer is disposed on the first part of the insulation layer and on a part of the second part of the insulation layer so that the conductive layer extends from the cell region to the part of the terminal region beyond the first part of the insulation layer.

2. The device according to claim 1, wherein
the terminal contact semiconductor region includes an edge, which is opposite to the cell region,
the first part of the insulation layer includes an edge, which is opposite to the cell region,
the conductive layer includes an edge, which is opposite to the cell region,
a first length is defined as a distance between the edge of the terminal contact semiconductor region and the edge of the first part of the insulation layer,
a second length is defined as a distance between the edge of the terminal contact semiconductor region and the edge of the conductive layer, and
a ratio between the first length and the second length is in a range between 0.13 and 0.61.

3. The device according to claim 1, wherein
the terminal contact semiconductor region includes an edge, which is opposite to the cell region,
the first part of the insulation layer includes an edge, which is opposite to the cell region,
the super junction structure in the intermediate semiconductor layer includes an edge, which is opposite to the cell region,
a first length is defined as a distance between the edge of the terminal contact semiconductor region and the edge of the first part of the insulation layer,
a third length is defined as a distance between the edge of the terminal contact semiconductor region and the edge of the super junction structure, and a ratio between the first length and the third length is in a range between 0.08 and 0.39.

4. The device according to claim 1, wherein
the terminal contact semiconductor region includes an edge, which is opposite to the cell region,
the conductive layer includes an edge, which is opposite to the cell region,
the super junction structure in the intermediate semiconductor layer includes an edge, which is opposite to the cell region,
a second length is defined as a distance between the edge of the terminal contact semiconductor region and the edge of the conductive layer,
a third length is defined as a distance between the edge of the terminal contact semiconductor region and the edge of the super junction structure, and
a ratio between the second length and the third length is in a range between 0.41 and 0.90.

5. The device according to claim 1, further comprising:
a second conductive type semiconductor region adjacent to the terminal contact semiconductor region, wherein
the second conductive type semiconductor region is disposed on another surface portion of the terminal upper semiconductor layer in the terminal region, and
the second conductive type semiconductor region has the second conductive type and an impurity concentration, which is lower than that of the terminal contact semiconductor region, and higher than that of the terminal upper semiconductor layer.

6. A semiconductor device comprising:
a cell region including a plurality of semiconductor switching cells;
a terminal region disposed around the cell region;
a lower semiconductor layer having a first conductive type;
an intermediate semiconductor layer disposed on the lower semiconductor layer, wherein the intermediate semiconductor layer includes a super junction structure, in which a first region having the first conductive type and a second region having a second conductive type are repeatedly arranged in a horizontal direction perpendicular to a thickness direction of the intermediate semiconductor layer, and wherein the first region extends in the thickness direction of the intermediate semiconductor layer, and the second region extends in the thickness direction of the intermediate semiconductor layer;
a terminal upper semiconductor layer disposed on the intermediate semiconductor layer in the terminal region, wherein the terminal upper semiconductor layer has the second conductive type and a low impurity concentration;
a terminal contact semiconductor region disposed on a surface portion of the terminal upper semiconductor layer in the terminal region, wherein the terminal contact semiconductor region is disposed adjacent to the cell region, and wherein the terminal contact semiconductor region has the second conductive type and a high impurity concentration;
a second conductive type semiconductor region adjacent to the terminal contact semiconductor region, wherein the second conductive type semiconductor region is disposed on another surface portion of the terminal upper semiconductor layer in the terminal region, and wherein the second conductive type semiconductor region has the second conductive type and an impurity concentration, which is lower than that of the terminal contact semiconductor region, and higher than that of the terminal upper semiconductor layer;

an insulation layer disposed on a part of the terminal contact semiconductor region and on the terminal upper semiconductor layer in the terminal region; and a conductive layer disposed on another part of the terminal contact semiconductor region and on a part of the insulation layer.

7. A method for manufacturing a semiconductor device including a cell region and a terminal region disposed around the cell region, wherein the cell region includes a plurality of semiconductor switching cells, the method comprising steps of:

preparing a lower semiconductor layer having a first conductive type;

forming an intermediate semiconductor layer on the lower semiconductor layer, wherein the intermediate semiconductor layer includes a super junction structure, in which a first region having the first conductive type and a second region having a second conductive type are repeatedly arranged in a horizontal direction perpendicular to a thickness direction of the intermediate semiconductor layer, and wherein the first region extends in the thickness direction of the intermediate semiconductor layer, and the second region extends in the thickness direction of the intermediate semiconductor layer;

forming a terminal upper semiconductor layer on the intermediate semiconductor layer in the terminal region, wherein the terminal upper semiconductor layer has the second conductive type and a low impurity concentration;

forming a terminal contact semiconductor region on a surface portion of the terminal upper semiconductor layer in the terminal region, wherein the terminal contact semiconductor region is disposed adjacent to the cell region, and wherein the terminal contact semiconductor region has the second conductive type and a high impurity concentration;

forming an insulation layer on the terminal upper semiconductor layer in the terminal region, wherein the insulation layer has first and second parts, the first part which is disposed adjacent to the cell region and has a small thickness, and the second part which is disposed adjacent to the first part of the insulation layer and has a large thickness, and wherein the first part of the insulation layer is disposed on the terminal contact semiconductor region and on a part of the terminal upper semiconductor layer; and forming a conductive layer in the cell region and a part of the terminal region, wherein the conductive layer is disposed on the first part of the insulation layer and on a part of the second part of the insulation layer so that the conductive layer extends from the cell region to the part of the terminal region beyond the first part of the insulation layer.

* * * * *